(12) United States Patent
Six

(10) Patent No.: US 7,545,026 B2
(45) Date of Patent: Jun. 9, 2009

(54) ELECTRONIC DEVICE COMPRISING AN INTEGRATED CIRCUIT

(75) Inventor: Jean-Claude G. Six, Saint Contest (FR)

(73) Assignee: NXP B.V., Eindhoven (NL)

( * ) Notice: Subject to any disclaimer, the term of this patent is extended or adjusted under 35 U.S.C. 154(b) by 4 days.

(21) Appl. No.: 11/632,518

(22) PCT Filed: Jul. 6, 2005

(86) PCT No.: PCT/IB2005/052241

§ 371 (c)(1),
(2), (4) Date: Nov. 5, 2007

(87) PCT Pub. No.: WO2006/008679

PCT Pub. Date: Jan. 26, 2006

(65) Prior Publication Data

US 2008/0191361 A1    Aug. 14, 2008

(30) Foreign Application Priority Data

Jul. 13, 2004  (EP) .................................. 04300442

(51) Int. Cl.
*H01L 23/495*  (2006.01)

(52) U.S. Cl. .............................. 257/676; 257/E23.037; 257/E23.039

(58) Field of Classification Search ................. 438/123; 257/780, E23.037, E23.039, 676
See application file for complete search history.

(56) References Cited

U.S. PATENT DOCUMENTS 4,685,998 A * 8/1987 Quinn et al. ................. 438/123
6,140,708 A * 10/2000 Lee et al. ..................... 257/780
6,737,750 B1   5/2004 Hoffman

FOREIGN PATENT DOCUMENTS

EP      1 357 596       10/2003

* cited by examiner

*Primary Examiner*—Davienne Monbleau
*Assistant Examiner*—Monica D Harrison

(57) ABSTRACT

An electronic device (ICD) comprises a signal ground contact (LD1) for coupling the electronic device to signal ground, a die pad, and an integrated circuit. The die pad (DPD) is provided with a protrusion (PTR3) that is electrically coupled to the signal ground contact. The integrated circuit (PCH) has a contact pad (GP2) that faces the protrusion of the die pad and that is electrically coupled thereto.

14 Claims, 9 Drawing Sheets

ELECTRONIC DEVICE COMPRISING AN INTEGRATED CIRCUIT

An aspect of the invention relates to an electronic device that comprises an integrated circuit. The electronic device may constitute, for example, a high-frequency signal processor. Other aspects of the invention relate to a method of manufacturing such an electronic device and a signal processing apparatus comprising such an electronic device.

An electronic device may have the following structure. An integrated circuit is mounted on a base that has a peripheral part and an inner part. The peripheral part comprises various contacts for coupling the electronic device to other electronic devices. At least one of these contacts is a signal ground contact. Contact pads of the integrated circuit are electrically coupled to contacts of the peripheral part of the base. The integrated circuit itself is located on the inner part of the base. The integrated circuit may form part of a stack of various electrical components. The stack may comprise a decoupling capacitor, which is electrically coupled to the integrated circuit. The stack may be fixed to the inner part of the base.

U.S. Pat. No. 6,227,260 describes an integrated circuit device that comprises a planar decoupling capacitor in a coplanar relationship with a semiconductor chip and a planar bonding element. The planar bonding element has a plurality of bond fingers and concentric power and ground rings. The semiconductor chip is positioned within the concentric power and ground rings. The planar decoupling capacitor is positioned close to the planar semiconductor chip. Wire connections electrically couple the planar semiconductor chip to the planar decoupling capacitor.

According to an aspect of the invention, an electronic device comprises a die pad provided with a protrusion, which die pad is coupled to an external ground. A contact pad at a first side of a first chip faces and is electrically coupled to the protrusion of the die pad. A second chip (ACH) is electrically coupled to further contact pads at the first side of the first chip with contact pads at a first side, while at a second side it faces the die pad.

The invention takes the following aspects into consideration: the high-frequency behavior of a circuit within the electronic device depends on the electrical path that couples the circuit to the ground. The lower the inductance of this electrical path is, the better the high-frequency behavior of the circuit will be. With chip-on-chip packages, also known as stacked die packages, the provision of a short electrical path to ground from the first chip is less self-evident. This is considered due to the design requirements in a chip-on-chip package. Moreover, the first chip has often a lateral extension that is substantially larger than that of the second chip; it acts in fact as a functional interposer. The use of protrusions constitutes a short and direct connection from the die pad, which acts as an intermediate ground to the first chip.

Examples of circuits for which a short connection to ground is of huge importance include decoupling capacitors, protection devices against electrostatic discharge, but also inductors and the like.

Preferably, there is an electrical and/or thermal connection from the second side of the second chip to the die pad. However, this is not explicitly needed; the protrusion may be used as an alternative. Herewith, assembly problems may be reduced. It is nevertheless suitable, although not explicitly needed, that the die pad has its conventional rectangular shape; first of all in view of the layout to the board, secondly, as a rectangular die pad with a protrusion is mechanically more stable and easier to handle than a protrusion only.

In an advantageous embodiment of the device, the protrusion is shaped as a wall that at least partly surrounds the second chip. In this embodiment, the grounded protrusion may form a Faraday's cage around the second chip, so as to protect this second chip against any electromagnetic interference.

The first chip comprises in a suitable embodiment passive functions only. Such passive functions include resistors, inductors and capacitors, and optionally diodes, such as pin or Zener diodes. Additionally MEMS elements and antennas may be present. Herewith basspandfilters, impedance matching networks, couplers, feedbacks and band switching circuits can be designed in the first chip. The first chip is suitable provided on a semiconductor substrate, but a substrate of insulating material is an alternative. The advantage of a semiconductor substrate is that its coefficient of thermal expansion is equal to that of the second semiconductor chip. As a consequence, the thermal stability of the complete electronic device is considerably improved. Good results have been obtained with high-ohmic silicon as the substrate. This material has the properties of an insulating substrate at high frequencies.

The second chip is suitably a semiconductor device, such as an amplifier, a transceiver or a driver chip. Alternatively, it may be a filter, such as a bulk acoustic wave filter, a switching element or array, such as a device including a microelectromechanical system (MEMS) element, a sensor such as a magnetoresistive sensor and the like. It may also be a separate memory chip, if so desired. In other words, such are chips of which integration into the first chip is technologically not feasible or commercially not attractive. It will be understood, that in the device of the present invention more than just one second chip can be provided. In fact, if there are more second chips, then the first chip will extend laterally much beyond these second chips, and the needs for a proper and local grounding is only larger.

The die pad is suitably part of a leadframe, as known to the skilled person. Leadframes of the QFN type are preferred, as they have leads that are SMD-mountable. A highly preferred variant hereof is known as the HVQFN-leadframe. In recent developments such a leadframe is formed with a sacrificial layer that is partly or completely removed from the bottom side of the leadframe. Alternatively, the die pad can be provided separately. Terminals may nevertheless be present on the first chip in an array-like configuration and be provided with solder bumps. Such a package is known per se as a chip scale package.

In a further advantageous embodiment, a shield is present at a second side of the first chip. Said shield is suitably connected to the protrusion with through-holes in the first chip. Techniques for forming through-holes in combination with trenches for application as a capacitive element are described in the non-prepublished application EP04300132.0 (PHNL040226). Optionally, the connection from the ground to the second side of the first chip may constitute a ground contact for further functions or chips provided at this second side of the first chip.

In another aspect of the invention, a leadframe comprising a die pad and a plurality of leads, which die pad is provided with a protrusion. As will be clear from the figures and the above mentioned description, the embodiment of a leadframe is the primary embodiment of the invention, and the invention is clearly embodied herein.

In a further aspect of the invention a method of manufacturing an electronic device according to the invention is provided, particularly as claimed in claim 2. This method comprises the steps of:

mounting the second chip with its second side to the die pad under formation of a subassembly, and assembling the first chip with the subassembly with bumps.

It has been found that the conventional assembly of a chip-on-chip construction as a whole to a leadframe is difficult. In one step, two connections must be made, and stress ought to be released. These connections are that between the second chip and the die pad, and that between the terminals on the first chip and the leads. The distance between the first chip and the leads is herein much bigger than that between the die pad and the second chip.

In the method of the invention, a subassembly is made first, which makes that in the next assembly step the two surfaces to be assembled are relatively planar. This contributes to a proper assembly.

These and other aspects of the invention will be described in greater detail hereinafter with reference to the drawings.

Figure 1:
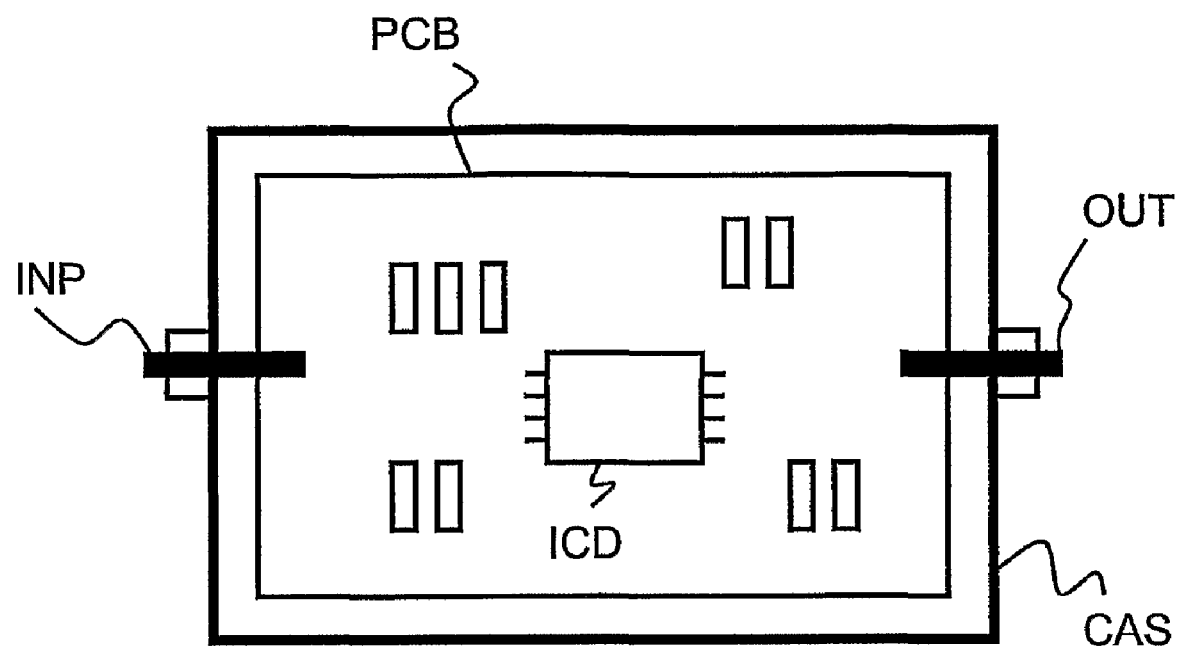
FIG. 1 is a diagram that illustrates a high-frequency amplifier.

FIG. 1 illustrates a high-frequency amplifier HFA. The high-frequency amplifier HFA comprises an input connection INP, a printed circuit board PCB with various components mounted thereon, an output connection OUT, and a casing CAS. An integrated circuit device ICD is one of these components. The integrated circuit device ICD is coupled to other components via the printed circuit board PCB. The integrated circuit device ICD comprises amplifier circuits that, in combination with other components on the printed circuit board PCB, amplify a high-frequency signal present at the input connection INP so as to obtain an amplified signal at the output connection OUT.

Figure 2:
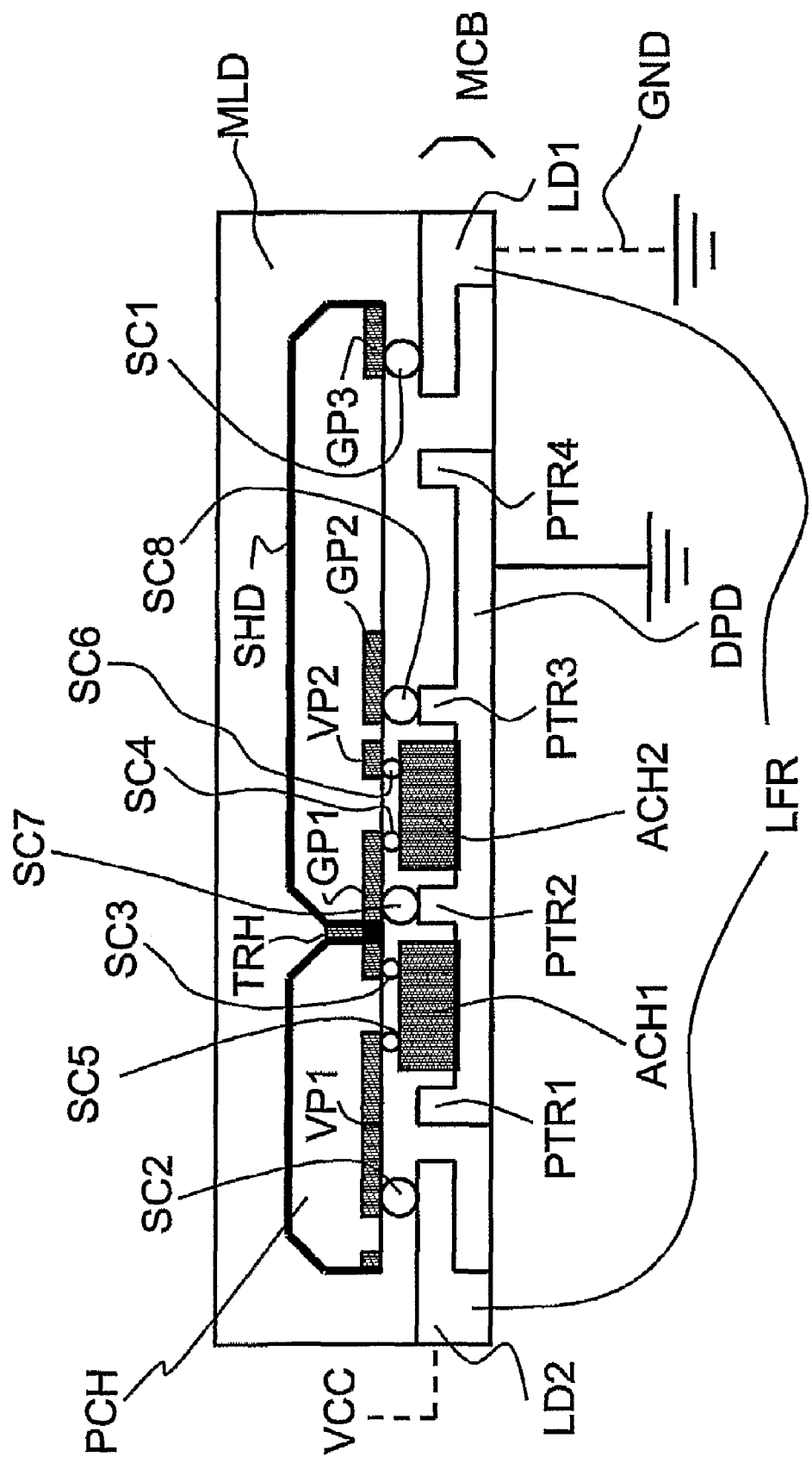
FIG. 2 is a cross section diagram that illustrates an integrated circuit device of the high-frequency amplifier.

FIG. 2 illustrates the integrated circuit device ICD. FIG. 2 is a diagrammatic cross section of the integrated circuit device ICD. The integrated circuit device ICD comprises a mounting-and-connection base MCB, two signal processing chips ACH1, ACH2 and a passive component chip PCH. These elements are covered by a mold compound MLD that provides mechanical protection. The mounting-and-connection base MCB preferably comprises a material that has a relatively high electrical and thermal conductivity. For example, the mounting-and-connection base MCB may be formed by an alloy that comprises copper.

The mounting-and-connection base MCB comprises a lead frame LFR and a die pad DPD. The lead frame LFR has various electrical leads LD for connecting the integrated circuit device ICD to other electrical devices. Electrical lead LD1 constitutes a connection to signal ground GND. Electrical lead LD2 constitutes a connection to a supply voltage VCC. The two signal processing chips ACH are fixed to the die pad DPD. The die pad DPD comprises various protrusions PTR. Protrusions PTR1 and PTR2 define a cavity in which signal processing chip ACH1 is located. Protrusions PTR2 and PTR3 define another cavity in which signal processing chip ACH2 is located.

The passive component chip PCH lies on top of the signal processing chips ACH. The passive component chip PCH comprises signal ground pads GP, supply voltage pads VP, a conductive shield SHD, and a through hole TRH filled with conductive material. The through hole TRH constitutes an electrical connection between the conductive shield SHD and signal ground pad GP1 of the passive component chip PCH. The passive component chip PCH further comprises decoupling capacitors. A decoupling capacitor is electrically coupled between signal ground pad GP1 and supply voltage pad VP1. A further decoupling capacitor is electrically coupled between signal ground pad GP1 and supply voltage pad VP2. The passive component chip PCH may further comprise electrical elements, such as, for example, diodes that provide protection against electrostatic discharges. Accordingly, a current that results from an electric discharge will substantially flow to signal ground via a low impedance path, which prevents the occurrence of a disruptive voltage peak.

The integrated circuit device ICD comprises various solder connections SC for electrically coupling the lead frame LFR, the die pad DPD, the signal processing chips ACH, and the passive component chip PCH with each other. Solder connection SC1 electrically couples the conductive shield SHD of the passive component chip PCH to the electrical lead LD1 that constitutes a connection to signal ground GND. Solder connection SC2 electrically couples supply voltage pad VP1 of the passive component chip PCH to the lead electrical LD2 that constitutes a connection to the supply voltage VCC. Supply voltage pad VP1 and supply voltage pad VP2 are electrically interconnected within the passive component chip. The signal processing chips ACH are coupled to signal ground via the solder connections SC3 and SC4, the through hole TRH and the conductive shield SHD of the passive component chip PCH, and solder connection SC1. Signal processing chips ACH1 is coupled to the supply voltage VCC via solder connection SC5, supply voltage paths VP1 of the passive component chip PCH, and solder connection SC2. Signal processing chips ACH2 is coupled to the supply voltage VCC via solder connection SC6, supply voltage paths VP2 of the passive component chip PCH, which is interconnected with supply voltage path VP1, and solder connection SC2.

The die pad DPD is electrically coupled to ground on its bottom side, where it is attached to a printed circuit board. In the present embodiment a connection from the one ground contact (the die pad DPD) to the other ground contact (the signal ground GND) is present, which operates as a suitable shield. This connection comprises solder connection SC7, the metallized through-hole TRH, the conductive shield SHD of the passive component chip PCH and the solder connection SC1. The signal ground contact pad GP2 of the passive component chip PCH is electrically coupled to the protrusion PTR3 of the die pad DPD via solder connection SC8

Figure 3:
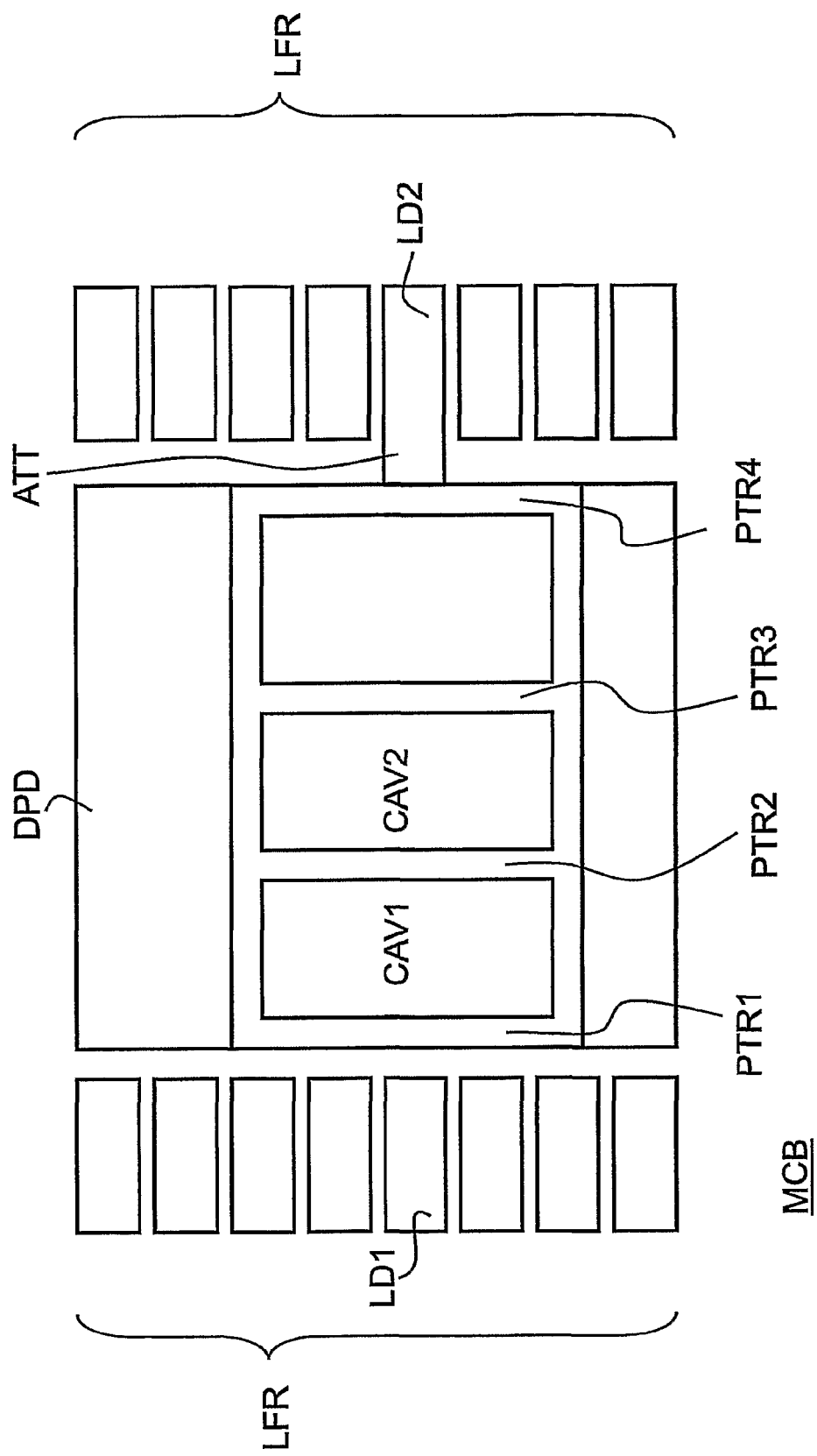
FIG. 3 is a top view diagram that illustrates a mounting-and-connection base of the integrated circuit device.

FIG. 3 illustrates the mounting-and-connection base MCB of the integrated circuit device ICD shown in FIG. 1. FIG. 3 is a top side view of the mounting-and-connection base MCB. The protrusions PTR form walls that define two cavities CAV for receiving the signal processing chips ACH illustrated in FIG. 2. Electrical lead LD2 has an attachment ATT to the die pad DPD, which constitutes an electrical coupling.

The solder connections SC, the conductive shield SHD and the through hole TRH of the passive component chip PCH, as well as the die pad DPD including its protrusions PTR, and the attachment ATT, have a relatively low impedance at high frequencies. As a result, high-frequency currents will preferably flow through these elements. Any high-frequency voltage that such a current flow might generate will be of relatively modest amplitude. Consequently, circuits that are present within the integrated circuit device ICD will have a satisfactory high-frequency behavior. Any signal crosstalk between circuits will be relatively modest. In addition, the wall-like protrusions PTR constitute a shield against electromagnetic interference. In effect, the wall-like protrusions PTR form a Faraday cage in combination with the rest of the die pad DPD and the passive component chip PCH, which is provided with the conductive shield SHD. This further contributes to a satisfactory high-frequency behavior of the integrated circuit device ICD.

Figure 4:
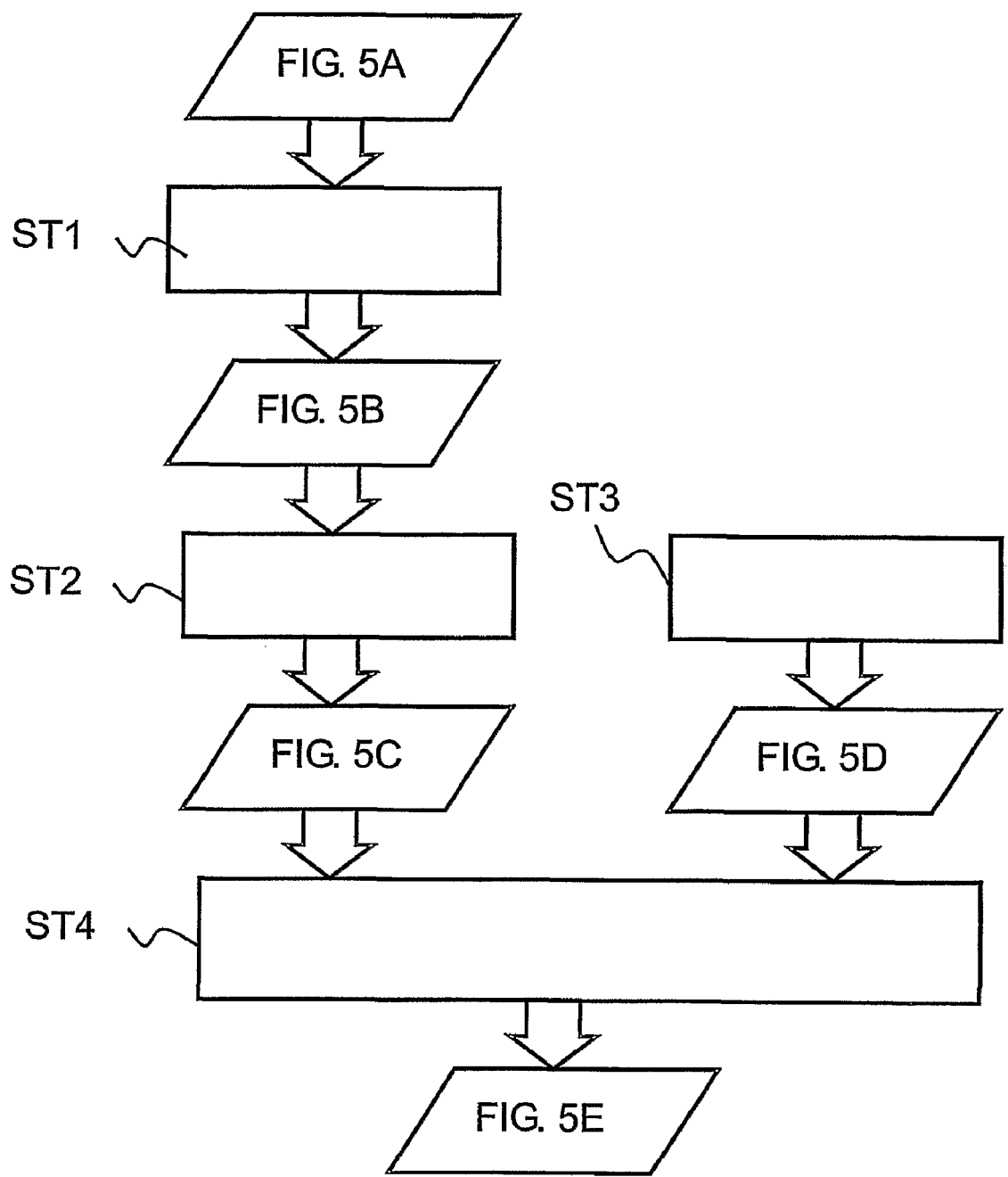
FIG. 4 is a flow chart diagram that illustrates a method of manufacturing the integrated circuit device.
Figure 5A:
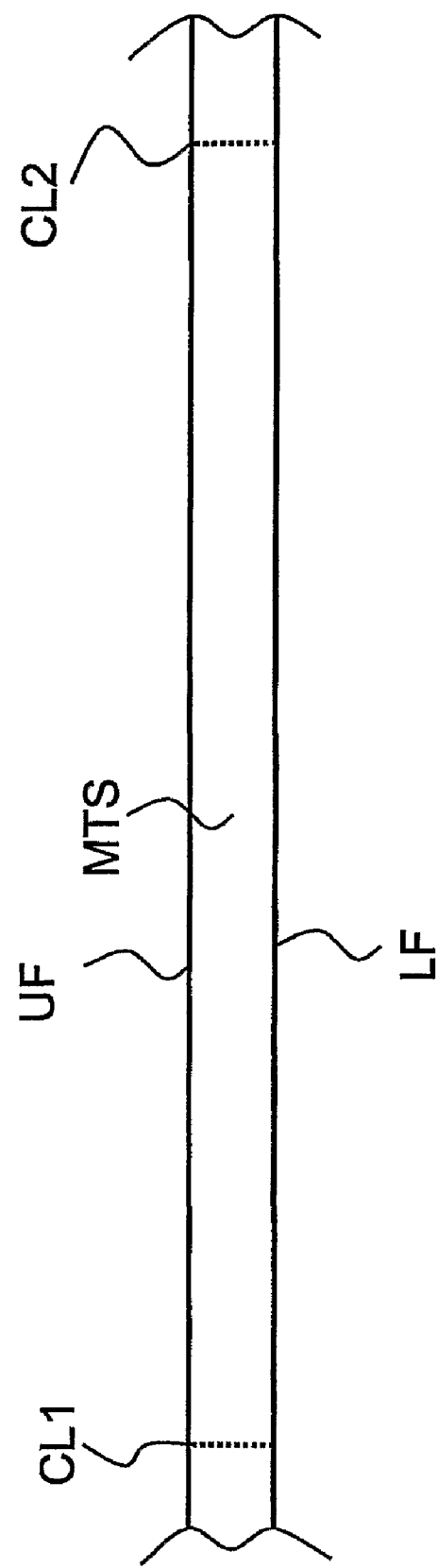
FIGS. 5A-5E are cross-section diagrams that illustrate intermediate products of the method.

FIG. 4 and FIGS. 5A-5E illustrate a method of manufacturing an integrated circuit device as shown in FIG. 2. FIG. 4 illustrates various steps ST of the method. FIGS. 5A-5E illustrate intermediate products of the method. FIG. 5A illustrates a metal strip MTS provided with cutting lines CL1 and CL2. The metal strip MTS has an upper face UF and a lower face LF.

In an etching step ST1, the upper face UF of the metal strip MTS is etched in accordance with a predefined pattern. The lower face LF of the metal strip MTS is also etched in accordance with a predefined pattern. The etching depth on both faces is approximately ⅔ of the distance between the upper face UF and the lower face LF, which is the thickness of the metal strip MTS.

Figure 5B:
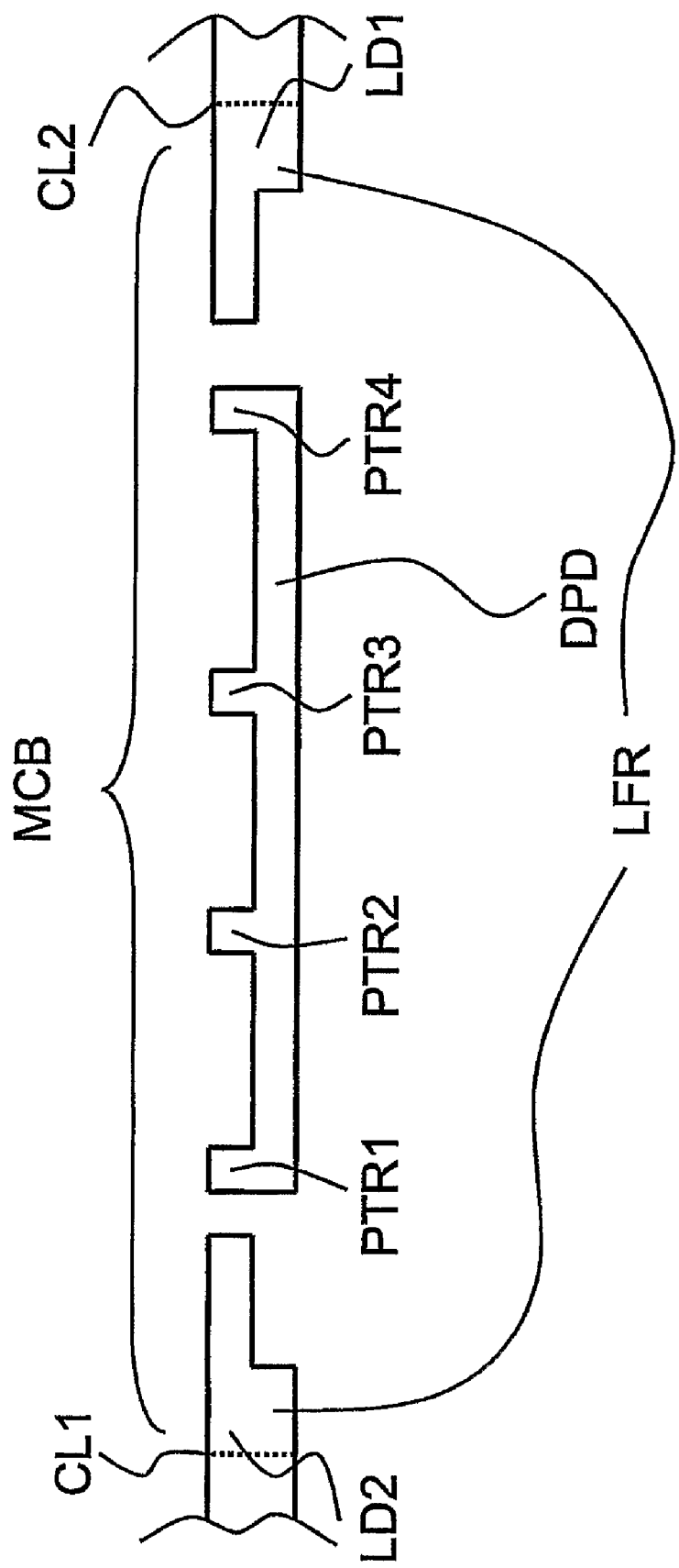

FIG. 5B illustrates a mounting strip that results from the etching step ST1. The lead frame LFR and the die pad DPD have been formed in the etching step ST1. The wall-like protrusions PTR of the die pad DPD, which define the cavities, have also been formed in the etching step ST1. The portion between the cutting lines CL1 and CL2 constitutes the mounting-and-connection base in accordance with the invention MCB.

Figure 5C:
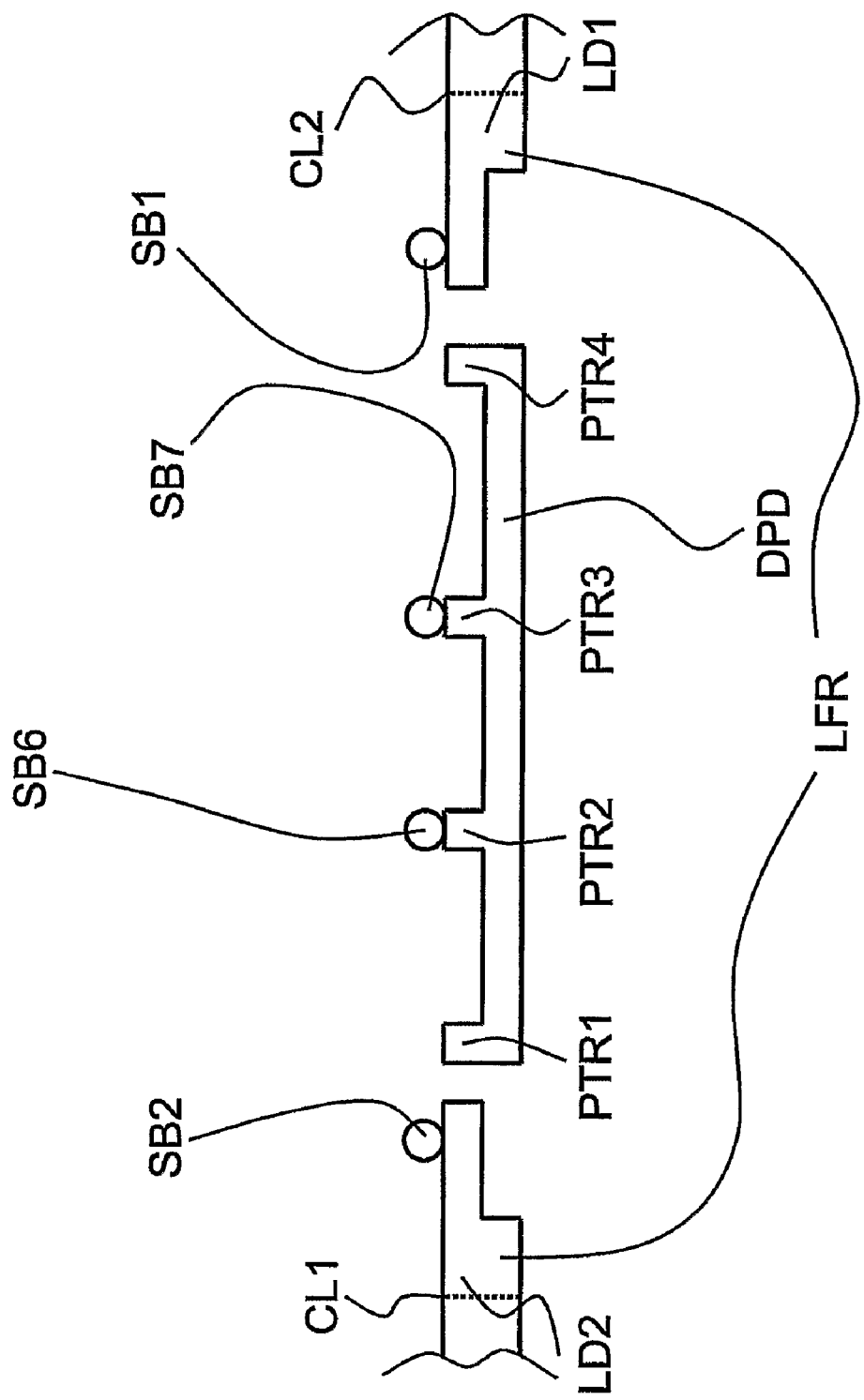

In a solder preparation step ST2, electrical leads LD of the lead frame LFR and the protrusions PTR of the die pad DPD are provided with solder balls SB. FIG. 5C illustrates a solder-prepared mounting strip that results from the solder preparation step ST2.

Figure 5D:
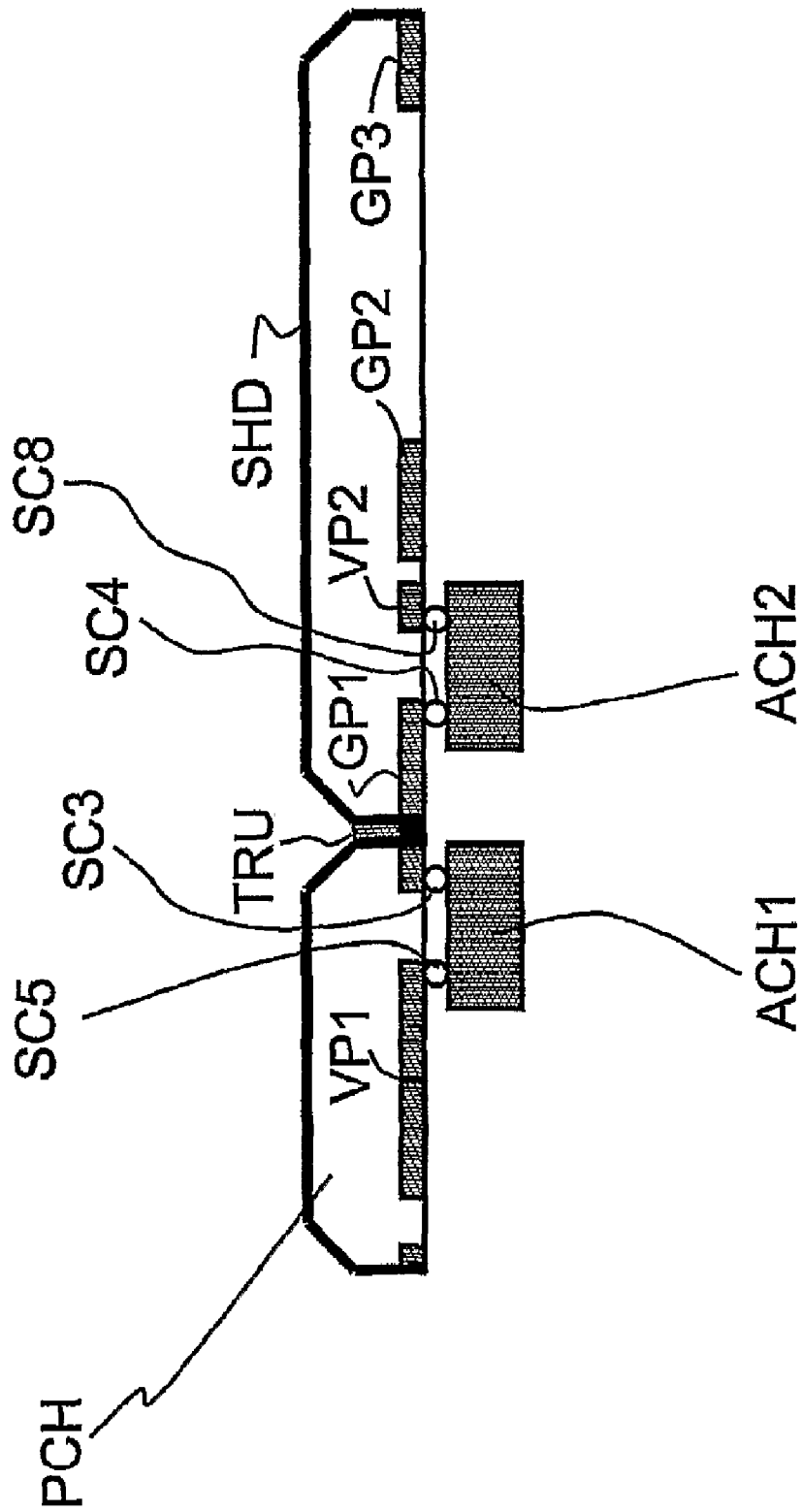

In a chip-to-chip fixation step ST3, the passive component chip PCH and the signal processing chips ACH are fixed to each other. FIG. 5D illustrates a chip assembly that results from the chip-to-chip fixation step ST3.

Figure 5E:
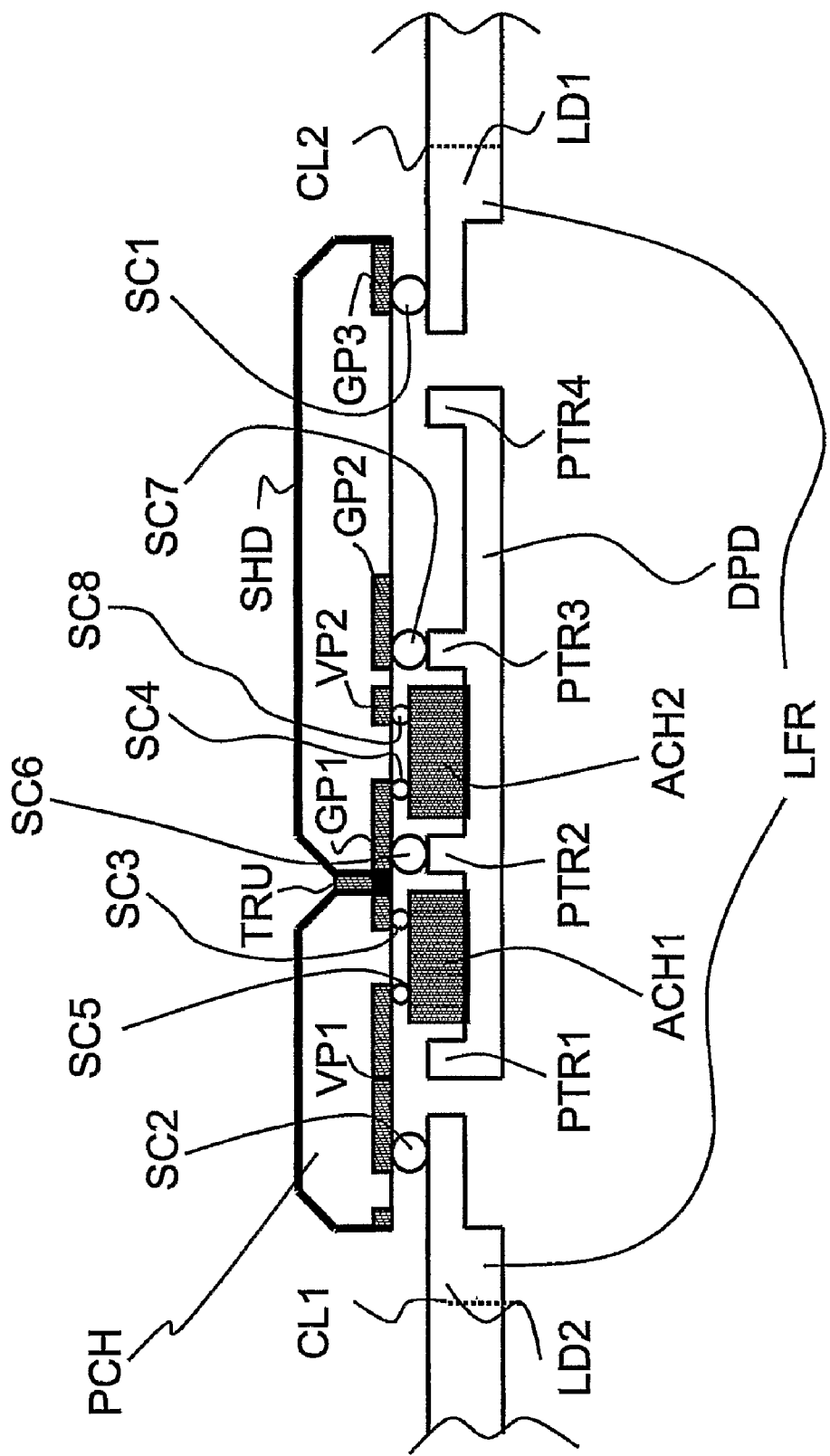

In a mounting step ST4, the chip assembly, which is illustrated in FIG. 5D, is mounted on the solder-prepared mounting strip, which is illustrated in FIG. 5E. The signal processing chips ACH are placed within the cavities and may optionally be fixed to the die pad DPD. The solder balls SB of the solder-prepared mounting strip are heated so as to form solder connections.

FIG. 5E illustrates a chip-mounted strip that results from the mounting step ST4. In further steps, which are not illustrated, a mold compound may be applied to the chip-mounted strip. Cuts along cutting line CL1 and along cutting line CL2 result in the integrated circuit device illustrated in FIG. 2.

The detailed description hereinbefore with reference to the drawings illustrates the following characteristics. An electronic device (integrated circuit device ICD) comprises a first chip (PCH) and a second chip (ACH) that is coupled to the first chip (PCH). Grounding of the first chip (PCH) is achieved not only by conventional signal ground contact in the form of a lead (electrical lead LD1), but also or additionally in the form of a contact pad (GP2) to a protrusion (PTR3) on the die pad (DPD). This contact pad (GP2) is located centrally, and hence nearer to the components present within the first chip and/or the second chip than the conventional grounding. As such, it constitutes an improved grounding connection with reduced impedance. Moreover, the presence of grounding contacts allows the provision of a shielding for the second chip (ACH) or at least a portion of the first chip (PCH).

The detailed description hereinbefore with reference to the drawings further illustrates the following optional characteristics. The contact pad (signal ground pad GP2) that faces the protrusion (PTR3) of the die pad (DPD), and is electrically coupled thereto, is located within a central zone of the first chip (passive component chip PCH). The central zone is the zone that lies within the peripheral zone defined by various contact pads (VP1, GP3) of the first chip (PCH) for connecting the first chip to the leads (LD). The contact pad that faces the protrusion has thus a more or less central location. Accordingly, a circuit within the first chip (PCH) can be coupled to this contact pad, and thus to ground, via a connection that is relatively short. The shorter the connection, the lower its inductance will be. Consequently, aforementioned characteristic allows a further improvement of the high-frequency behavior.

The detailed description hereinbefore with reference to the drawings further illustrates the following optional characteristics. The electronic device (integrated circuit device ICD) comprises an interposition integrated circuit (signal processing chip ACH1 or ACH2) that is arranged between the integrated circuit (passive component chip PCH) and the die pad (DPD). This allows a functional partitioning between two different chips which allows a better price/performance ratio.

The detailed description hereinbefore with reference to the drawings further illustrates the following optional characteristics. One of the integrated circuits (passive component chip PCH) comprises a decoupling capacitor that is electrically coupled to the other integrated circuit (signal processing chip ACH). This allows an electrical decoupling path with a relatively low impedance, which further contributes to a good high-frequency behavior.

The detailed description hereinbefore with reference to the drawings further illustrates the following optional characteristics. The protrusion (PTR3) of the die pad (DPD) is shaped as a wall that at least partly surrounds the interposition integrated circuit (signal processing chip ACH). The wall-like protrusion constitutes a Faraday's cage, which further contributes to a good high-frequency behavior.

The aforementioned characteristics can be implemented in numerous different manners. In order to illustrate this, some alternatives are briefly indicated. The integrated circuit may be the only integrated circuit that the electronic device comprises or even the only electrical component. The integrated circuit may comprise one or more signal processing circuits. The protrusions need not necessarily be shaped as a wall; they may have any shape. The protrusions may be shaped as, for example, rods, cylinders, cubes, or pyramids. The contact pad of the integrated circuit that faces the protrusion of the die pad may electrically be coupled thereto by means of, for example, a conductive adhesive. It should further be noted that the electronic device in accordance with the invention may be applied in any type of signal processing apparatus. The high-frequency amplifier illustrated in FIG. 1 is merely an example. The electronic device may be applied in, for example, a computer or a digital signal processor for processing high-speed data.

Furthermore, the specific embodiments in the detailed description hereinbefore with reference to the drawings can be implemented in numerous different manners. In order to illustrate this, some alternatives are briefly indicated. Any of the signal processing chips ACH illustrated in FIG. 2 may be replaced by an electrical component of a different type. It is also possible to omit the signal processing chips ACH without replacing those by one or more other electrical components. In such an alternative embodiment, the passive component chip PCH may be replaced by a chip that comprises a signal processing circuit and one or more passive components such as, for example, decoupling capacitors. It is equally possible to replace the passive component chip PCH by an active component chip and to replace signal processing chips ACH by one or more passive component chips.

It should further be noted that the conductive shield SHD and the through hole TRH of the passive component chip PCH may be omitted. The die pad DPD may electrically be coupled to the electrical lead LD1 that constitutes signal ground GND solely via the attachment ATT illustrated in FIG. 3.

The etching step ST1 illustrated in FIG. 4 may be followed by a deformation step in which the etched metal strip is deformed to a certain extent so as to position the lead frame and the die pad with respect to each other as illustrated in FIG. 2. It is also possible to replace the etching step by another step in which a different technique is used to form the mounting-and-connection base MCB from a metal strip MTS. For example, the mounting-and-connection base MCB can be formed by a stamping machine, which removes material from the metal strip MTS by means of a mechanical action rather than a chemical action. It is further possible to first mount the signal processing chips ACH individually on the mounting and connection base MCB and, subsequently, to mount the passive component chip PCH on the mounting and connection base MCB while fixing the passive component chip PCH to the signal processing chips ACH.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. An electronic device comprising:
   a die pad comprising a protrusion and a ground contact for connection to an external ground;
   a first chip comprising a contact pad on a first side of the first chip, wherein the contact pad faces and is electrically coupled to the protrusion of the die pad;
   an interposition second chip comprising a contact pad on a first side of the second chip, wherein the contact pad faces and is electrically coupled to the contact pad on the first side of the first chip, and wherein an opposite second side of the second chip faces the die pad, wherein the second chip is interposed between the die pad and the first chip.

2. An electronic device as claimed in claim 1, wherein the die pad is electrically coupled to the second side of the second chip.

3. A method of manufacturing an electronic device as claimed in claim 2, comprising the steps of:
   mounting the second chip with its second side to the die pad under formation of a subassembly, and
   assembling the first chip with the subassembly with bumps.

4. An electronic device as claimed in claim 1, wherein the protrusion of the die pad is shaped as a wall that at least partly surrounds the second chip.

5. An electronic device as claimed in claim 1, wherein the first chip is provided with terminals for coupling to an external board, said terminals being located on the first side of the first chip.

6. An electronic device as claimed in claim 5, wherein solder balls are provided on the terminals so as to form a chip-scale package.

7. An electronic device as claimed in claim 5, wherein the terminals are coupled to leads, said leads and said die pads being part of a leadframe.

8. An electronic device as claimed in claim 5, wherein the first chip comprises through-holes extending from the first side to an opposite second side, at which second side an electrically conducting shield layer is present.

9. A signal processing apparatus comprising an electronic device as claimed in claim 1 and a substrate that couples the electronic device to other electronic devices of the signal processing apparatus.

10. An apparatus comprising:
    a leadframe comprising a die pad and a plurality of leads;
    wherein the die pad is configured to mount a plurality of chips arranged in a stacked die package with a contact pad of a first chip facing a contact pad of a second chip, wherein the die pad comprises:
    a protrusion for coupling the die pad to the contact pad of the first chip;
    wherein the protrusion at least partially defines a location, adjacent to the protrusion, for the second chip to be arranged between the first chip and the die pad.

11. The apparatus of claim 10, wherein the protrusion at least partially defines a cavity for the second chip to be arranged within the cavity between the first chip and the die pad.

12. The apparatus of claim 10, further comprising the first and second chips, wherein the contact pad of the second chip is connected to the external ground via the die pad and the contact pad of the first chip.

13. The apparatus of claim 12, wherein a second side of the second chip, opposite the first side of the second chip, is electrically coupled to the die pad.

14. The apparatus of claim 10, wherein the protrusion at least partially defines a Faraday cage for the second chip to shield the second chip.

* * * * *